United States Patent [19]

Kobayashi et al.

[11] Patent Number: 4,604,159
[45] Date of Patent: Aug. 5, 1986

[54] METHOD OF FORMING A LARGE NUMBER OF MONOCRYSTALLINE SEMICONDUCTOR REGIONS ON THE SURFACE OF AN INSULATOR

[75] Inventors: Yutaka Kobayashi; Akira Fukami, both of Hitachi; Takaya Suzuki, Katsuta, all of Japan

[73] Assignee: Hitachi, Ltd., Tokyo, Japan

[21] Appl. No.: 620,023

[22] Filed: Jun. 13, 1984

[30] Foreign Application Priority Data

Jun. 13, 1983 [JP] Japan .................................. 58-105275

[51] Int. Cl.[4] ............................................. C30B 13/20
[52] U.S. Cl. ...................... 156/617 R; 156/DIG. 73; 156/DIG. 80; 148/176; 148/DIG. 3; 148/DIG. 50; 148/DIG. 71; 148/DIG. 74; 148/DIG. 152; 29/576 T
[58] Field of Search .................. 156/603, 612–614, 156/617 R, DIG. 64, DIG. 80, DIG. 73, DIG. 111, DIG. 62; 427/53.1, 95; 148/1.5, 176, DIG. 3, DIG. 15, DIG. 25, DIG. 50, DIG. 71, DIG. 74, DIG. 93, DIG. 152; 75/65 ZM; 29/576 T

[56] References Cited

U.S. PATENT DOCUMENTS

| | | | |
|---|---|---|---|
| 4,046,618 | 9/1977 | Chaudhari et al. | 156/617 R |
| 4,196,041 | 4/1980 | Baghdadi et al. | 156/DIG. 65 |
| 4,283,235 | 8/1981 | Raffel et al. | 156/612 |
| 4,309,225 | 1/1982 | Fan et al. | 156/DIG. 80 |
| 4,330,363 | 5/1982 | Biegesen et al. | 156/603 |
| 4,346,513 | 8/1982 | Nishizawa et al. | 156/613 |
| 4,400,411 | 8/1983 | Yuan et al. | 156/612 |
| 4,448,632 | 5/1984 | Akasaka | 156/612 |
| 4,487,639 | 12/1984 | Lam et al. | 156/603 |

OTHER PUBLICATIONS

T. I. Kamins et al., MOSFETs in Laser-Recrystallized Poly-Silicon on Quartz, IEEE Electron Device Letters, vol. EDL-1, No. 10, Oct. 1980, pp. 214–216.
Giora Yaron et al., LASOS-Laser Annealed Silicon on Sapphire, IEEE Transactions on Electron Devices, vol. ED-27, No. 3, Mar. 1980, pp. 573–578.
M. W. Geis, Orientation Selection by Zone-Melting Silicon Films Through Planar Constrictions, Appl. Phys. Lett. 41(8), Oct. 15, 1982, pp. 747–749.

Primary Examiner—David L. Lacey
Attorney, Agent, or Firm—Antonelli, Terry & Wands

[57] ABSTRACT

Disclosed is a method of forming a large number of monocrystalline silicon regions, of uniform orientation, on the surface of an insulator material. Initially, a large number of island regions of amorphous or polycrystalline silicon, thermally connected to one another in a predetermined direction by connecting regions, are provided. Then such island regions are sequentially melted and regrown in such predetermined direction so as to form the monocrystalline semiconductor regions, with such regions having a uniform orientation. Thereafter, such connecting regions can be removed in order to isolate the island regions. The connecting regions can be formed with gaps, whereby such connecting regions need not be removed. The connecting regions can be formed of materials having a higher heat conductivity than that of the material of the island regions, and/or the connecting regions can have a smaller cross-sectional area at right angles to the predetermined direction than that of the island regions. Such island regions can be utilized for forming semiconductor elements, such as MOS FETs, therein.

35 Claims, 21 Drawing Figures

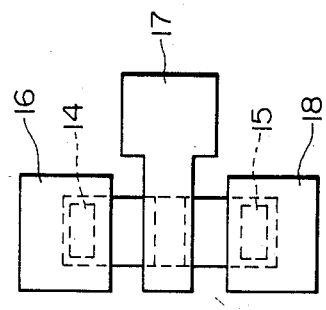
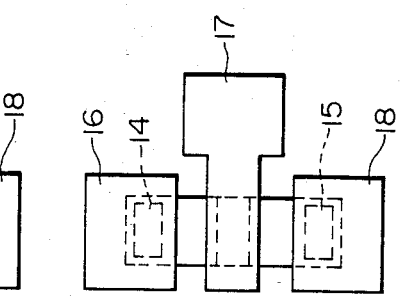
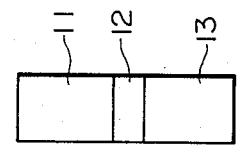
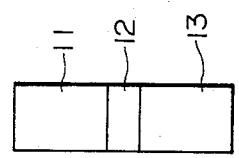
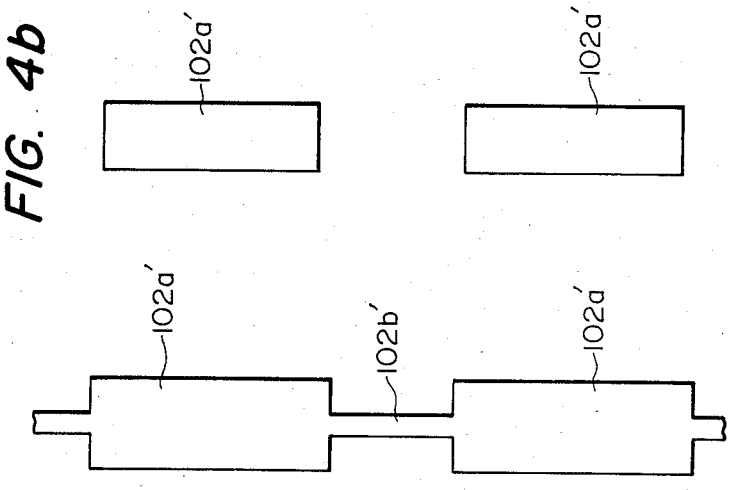

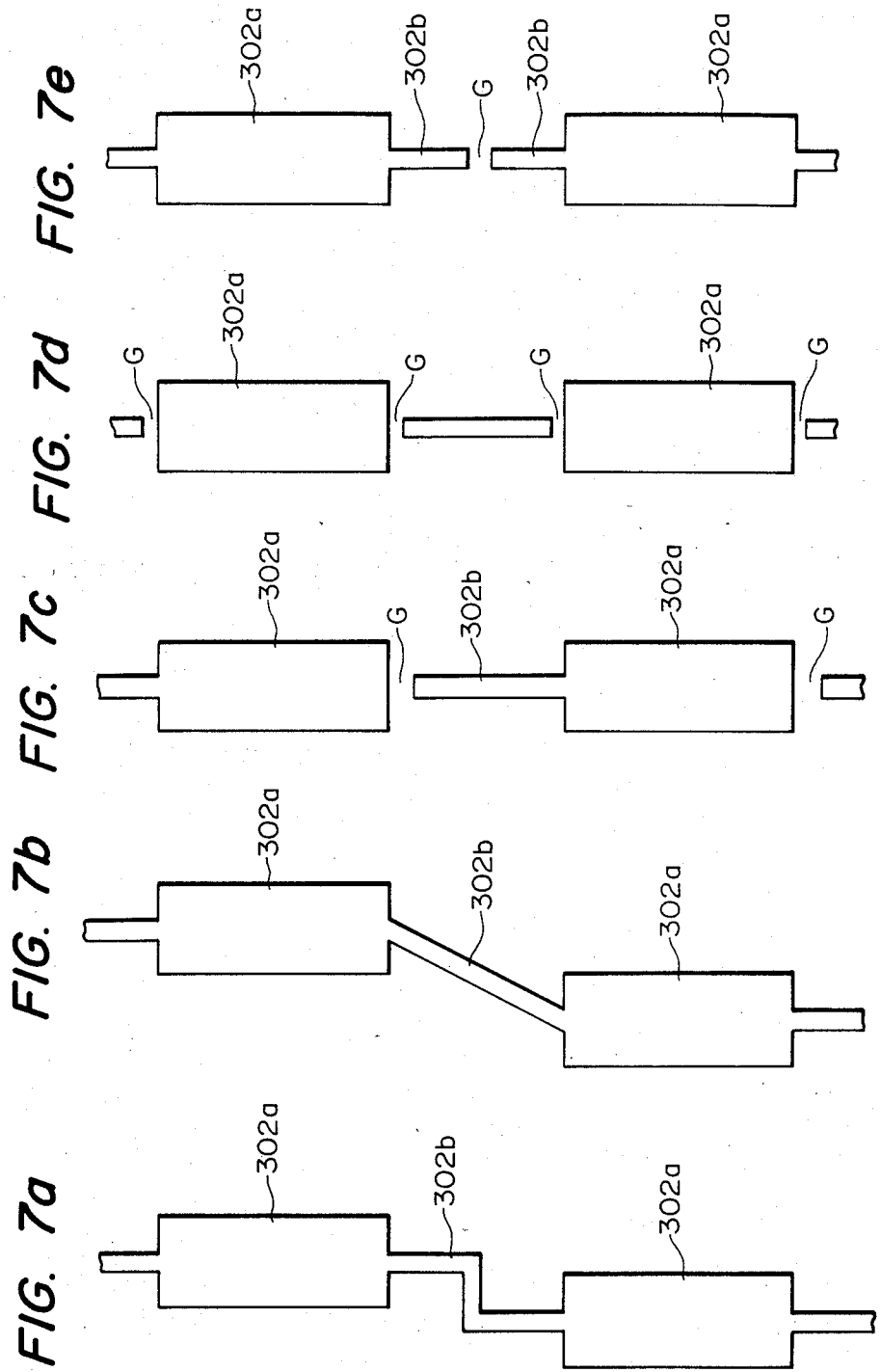

METHOD OF FORMING A LARGE NUMBER OF MONOCRYSTALLINE SEMICONDUCTOR REGIONS ON THE SURFACE OF AN INSULATOR

BACKGROUND OF THE INVENTION

This invention relates generally to an improvement in a method of forming a large number of monocrystalline semiconductor regions in juxtaposition on an insulator substrate or film.

Silicon-on-sapphire (SOS) technology and silicon-in-insulator (SOI) technology have been known in the past as methods of forming monocrystalline semiconductor regions on the surface of an insulator. (Refer to the article on pages 573–578 of IEEE TRANSACTIONS ON ELECTRON DEVICES, Vol. ED-27, No. 3, Mar., 1980, and the article in IEEE ELECTRON DEVICE LETTERS, Vol. EDL-1, No. 10, Oct., 1980.) In SOS technology, a monocrystalline sapphire is employed as an insulator substrate, a polycrystalline or amorphous silicon layer is formed on this substrate, and this silicon layer is changed into a monocrystalline layer by laser annealing, for example. This technique is suitable for forming a high quality monocrystalline layer on an insulator, but has not yet been put to practical use because monocrystalline sapphire is expensive. On the other hand, in SOI technology amorphous quartz, glass or the like is employed as the insulator substrate, a polycrystalline or amorphous silicon layer is formed on this substrate, and the silicon layer changed into a monocrystalline layer by laser annealing, for example. This technique can eliminate the disadvantage of SOS technology, but has the new problem that cracks develop in the silicon layer after the laser annealing, because of the difference in the thermal expansion coefficients of the insulator substrate and the silicon layer.

In order to solve this problem, a method has been proposed in which the polycrystalline or amorphous silicon layer on the insulator substrate is divided into large number of island regions by grooves, and thereafter the silicon layer is changed into a monocrystalline layer. (Refer to the article in IEEE ELECTRON DEVICE LETTERS, Vol. EDL-1, No. 10, Oct., 1980.) In accordance with this method, however, the plane orientation of the crystals in the island regions which will become the monocrystal are non-uniform, and are generally (111) and (110). When semiconductor devices are formed in the island regions, therefore, the characteristics of the devices are non-uniform. More concretely, when MOSFETs are formed in the island regions, their threshold voltages, operating speeds and leakage currents are non-uniform; and when bipolar transistors are formed therein, their current amplification ratios $h_{fe}$ and leakage currents are non-uniform. Non-uniformity of the device characteristics results in a drop in production yield when integrated circuits with a large number of island regions are produced.

SUMMARY OF THE INVENTION

It is, therefore, an object of the present invention to provide a method of forming a large number of monocrystalline semiconductor regions on the surface of an insulator, eliminating the problems of the prior-art technology described above.

It is another object of the present invention to provide a method of forming a large number of monocrystalline semiconductor regions with a uniform plane orientation on the surface of an insulator, as well as the product formed thereby.

It is another object of the present invention to provide a method of forming semiconductor devices, e.g., MOS FETs, using such monocrystalline semiconductor regions with a uniform plane orientation on the surface of an insulator, and product formed thereby.

The method of the present invention which accomplishes these objects is characterized in that means is provided for thermally connecting a large number of island regions consisting of a polycrystalline or amorphous semiconductor material which are juxtaposed with one another on the surface of an insulator, at least in the direction of regrowth.

The inventors of this invention have made intensive studies into why the orientations of regrown monocrystalline regions are not uniform, when island regions consisting of polycrystalline or amorphous semiconductor juxtaposed on the surface of an insulating material have been melted and regrown. As a result, the inventors have clarified the following. Since the island regions are formed on an insulator which has a low heat conductivity and are surrounded by the insulator or a gas (around their upper and side surfaces), each island region is thermally independent of the others. For this reason, the island regions that have melted during the recrystallization treatment are super-cooled as they cool. (The term "super-cooling" refers to the phenomenon in which an island region remains in a molten state even after its temperature has fallen below its melting point. If this phenomenon occurs, crystallization takes place instantaneously, for some reason or other.) Even if super-cooling does not occur, the heat flow runs in various directions so that the regrowth nuclei occur at at least two positions. Accordingly, since the regrowth proceeds from at least two nuclei acting as seeds, the island regions that are recrystallized exhibit a non-uniformity of orientation. If the island regions are thermally connected to one another in the regrowth direction, as in the present invention, the thermal isolation of each island region can be prevented, and the occurrence of super-cooling, or a state close thereto, can be eliminated. As a result, the regrowth direction is unidirectional, and a large number of island regions consisting of monocrystalline semiconductor and which have a uniform orientation can be obtained.

Typical examples of means for thermally connecting the island regions to one another include a method in which connecting members made of a material the same as, or different from, the material of the island regions, and which are narrower in width than the island regions, are arranged between the island regions in the regrowth direction; a method in which connecting members made of a material the same as, or different from, the material of the island regions, and which are thinner than the island regions, are provided between the island regions; a method in which connecting members have a higher heat conductivity than that of the semiconductor, and which are narrower than the island regions, are provided between the island regions in the regrowth direction; a method in which connecting members which have a higher heat conductivity than that of the semiconductor, and are thinner than the island regions, are provided between the island regions.

Monocrystalline, sintered SiC bodies, Ta, W MO, C, etc., can be used as the material with a higher heat conductivity than that of the semiconductor. It is preferable, from the aspect of the production process, to make the connecting members of the same material as that of the island regions. Although it is also preferably to connect the connecting members to the island regions, gaps may be provided at intermediate portions of the connecting members or between the connecting members and the island regions.

The insulator on which the island regions are formed is a sheet made of an inexpensive material, such as a sheet of amorphous quartz, a glass sheet, a silicon sheet on the surface of which is formed an amorphous $SiO_2$ or $Si_3N_4$ film, etc.

The method of changing the island regions into monocrystalline regions, that is, the regrowth method, is a zone-melting regrowth method in which a high frequency (radio frequency) coil, laser beam, electron beam, strip heater or mercury lamp is used as the heat source.

The present invention can be applied to the formation of a monocrystalline layer of any semiconductor material, such as Si, Ge, GaAs, GaP, InP, GaAsP, GaAlAsP, InGaP, InGaAsP, etc., on an insulator sheet.

Other characterizing features of the present invention will become more apparent from the following description of the embodiments thereof.

BRIEF DESCRIPTION OF THE DRAWINGS

FIG. 2b is an enlarged plan view and a sectional view of principal portions of FIG. 2a;

FIG. 2c is a graph of the temperature distribution over the upper surface of the susceptor of the apparatus of FIG. 2a;

FIGS. 4a through 4d are process diagrams of the method of forming devices on the semiconductor substrate, obtained by the method of the present invention;

FIGS. 7a through 7e show other examples of the pattern of the semiconductor layer on the seminconductor substrate.

DESCRIPTION OF PREFERRED EMBODIMENTS

Figure 1:
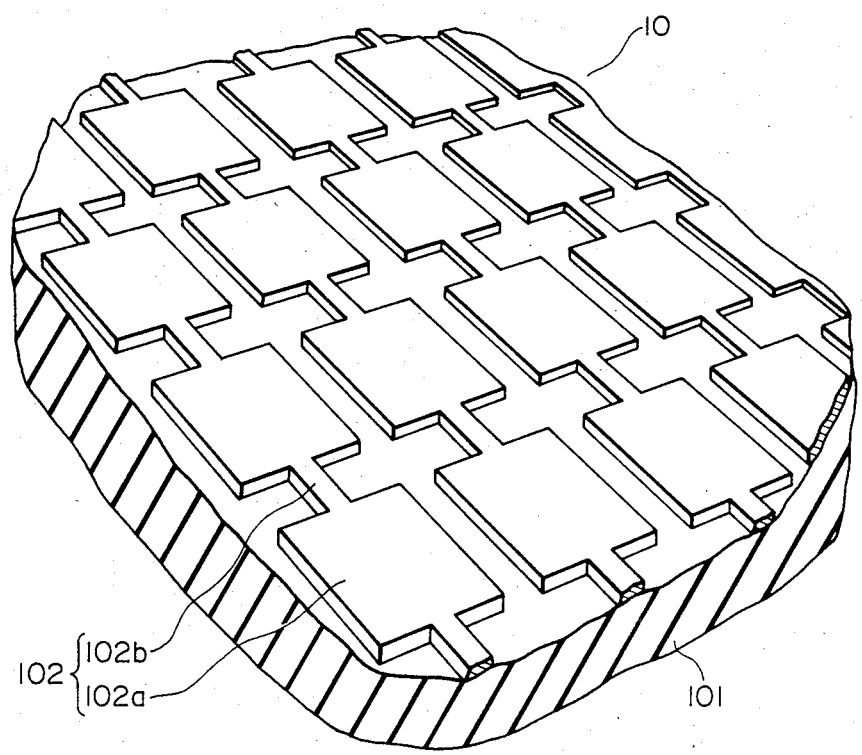
FIG. 1 is a schematic perspective view of one example of a semiconductor substrate used for the method of the present invention.

FIG. 1 shows a typical example of a semiconductor substrate which consists of an insulator sheet and a polycrystalline or amorphous semiconductor layer formed on the insulator sheet to a predetermined pattern, and which is used for the method of the present invention. The semiconductor substrate 10 consists of a silica sheet 101 with a polycrystalline or amorphous semiconductor layer 102 formed on one of the planes of the substrate. A plurality of lengths of semiconductor layer 102 are juxtaposed in the longitudinal and transverse directions with predetermined gaps between them, and each length consists of a large number of rectangular island regions 102a, with connecting regions 102b which connect the island regions 102a to one another in one direction and are narrower than the island regions.

The semiconductor substrate 10 is produced in the following way. First an approximately 500 μm-thick silica quartz plate whose surfaces are optically polished is prepared. A 0.75 μm-thick polycrystalline layer is deposited over the entire surface of one of the planes of this silica plate by chemical vapor deposition (CVD). The polycrystalline silicon layer is then selectively dry-etched into a pattern such as that shown in FIG. 1. The pattern dimensions are, for example, such that the island regions are 80 μm long and 30 μm wide, the gaps between the island regions are 20 μm and the connecting regions are 20 μm long and 5 μm wide.

Then the entire surface of the semiconductor substrate 10, on which the semiconductor layer 102 of the predetermined pattern is formed, is covered with a 1.2 μm-thick $SiO_2$ film, this $SiO_2$ film being formed by, e.g., CVD or PVD (physical vapor deposition, e.g., sputtering and evaporation). Thereafter, the substrate is transferred to a step in which the semiconductor layer 102 is changed into a monocrystalline layer.

Figure 2A:
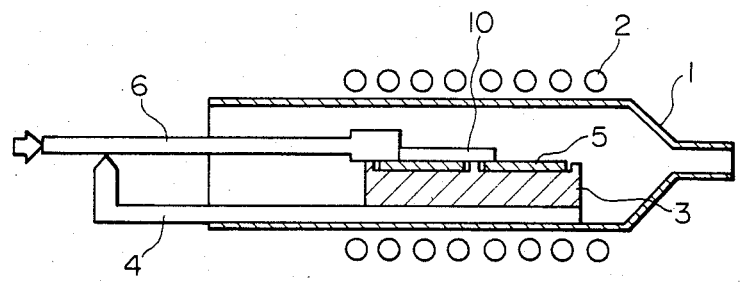
FIG. 2a is a schematic sectional view of one example of a zone-melting apparatus used for the method of the present invention.
Figure 2B:
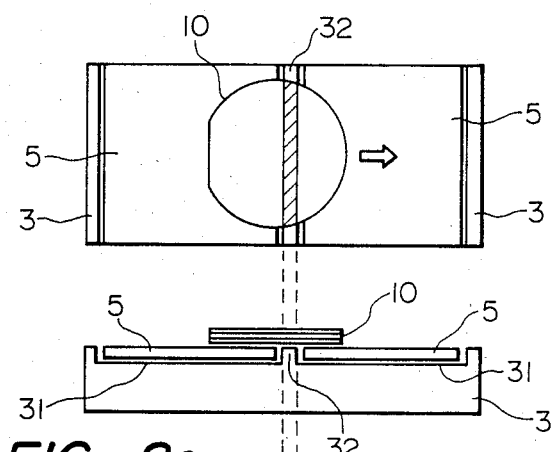

A narrow zone-melting regrowth apparatus used for the recrystallization of the semiconductor layer will now be described with reference to FIG. 2a and FIG. 2b. In FIG. 2a, reference numeral 1 represents a quartz tube, numeral 2 a work coil arranged around the outer circumference of the quartz tube 1, numeral 3 a carbon susceptor positioned within the quartz tube 1, numeral 4 a quartz support bed of which one end supports the carbon susceptor and the other end extends outside the quartz tube 1, numeral 5 denotes a pair of heating buffer plates provided in recesses 31 in the upper surface of the carbon susceptor 3, and numeral 6 a quartz push rod for moving the semiconductor substrate 10 along the carbon susceptor 3. This push rod is driven by a motor in the axial direction of the quartz tube 1.

Figure 2C:
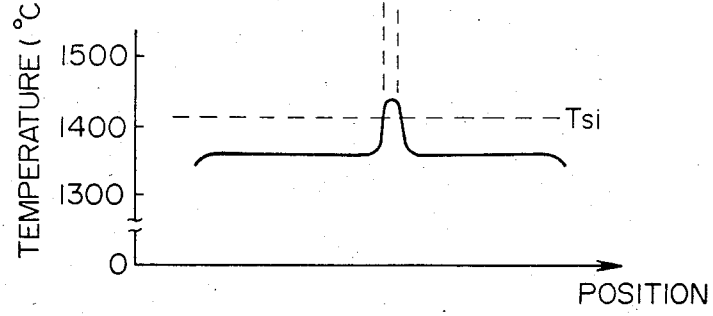

The characterizing feature of this apparatus resides in the construction of the carbon susceptor. The recesses 31 for guiding the two heating buffer plates 5 are defined parallel to each other on the upper surface of the carbon susceptor, and a separator wall 32 is positioned between the recesses in such a manner that it extends in a direction at right angles to the axial direction of the quartz tube 1. This construction provides the following effect. Even when the carbon susceptor 3 is heated by the work coil 2 to a temperature above the melting point of the semiconductor ($T_{Si}$ in FIG. 2c represents the melting point, 1,412° C., of silicon), the temperature distribution is as shown in FIG. 2c on the upper surfaces of the heating buffer plates 5 on which the semiconductor substrate 10 moves, because of the presence of the heating buffer plates 5. In other words, only the narrow portion of the carbon susceptor 3 which corresponds to the separator wall 32 between the heating buffer plates 5, and which extends in the direction at right angles to the axial direction of the quartz tube 1, reaches the temperature above the melting point of the semiconductor. Accordingly, if the semiconductor substrate 10 is placed on the carbon susceptor 3 and is moved in the direction indicated by the arrow in FIG. 2b, a melting zone A (represented by hatching) moves from one side to the other of the semiconductor substrate 10, and recrystallization by melting regrowth can be accomplished.

Figure 3:
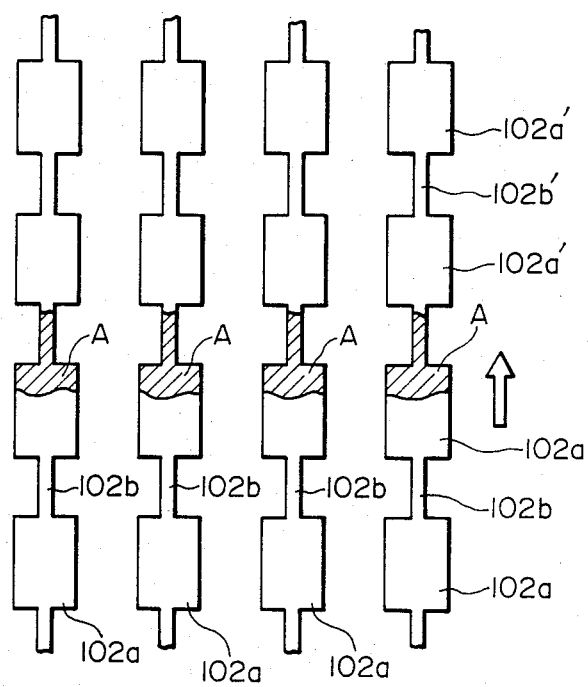
FIG. 3 is a plan view of a semiconductor substrate which illustrates the melt-regrowth steps.

It is necessary in the present invention that the relationship between the direction of movement of the semiconductor substrate 10 and the pattern of the semiconductor layer 102 is such that the direction in which the island regions 102a are connected coincides substantially with the direction of movement (represented by the arrow) of the substrate 10, as shown in FIG. 3. This is essential in order that monocrystalline island regions 102a of a uniform plane orientation are formed. If the direction in which the island regions 102a are connected coincides with the direction of movement of the substrate 10, the melting region A only lies in the connection direction during the recrystallization, and the direction of flow of the heat coincides with the connection direction, so that the heat flow is smooth. As a result, super-cooling does not occur during the regrowth, and monocrystalline island regions 102a' which have a well aligned orientation, particularly a uniform (100) plane, can be obtained. It has been confirmed that when this semiconductor substrate is melted and regrown in conditions in which the temperature of the melting region A is 1,450° C., its width in the direction of movement is 1 mm, and it speed is 0.5 mm/sec, each island region consists of monocrystalline silicon with a (100) orientation, and there are no grain boundaries with a large angle of inclination. It has also been confirmed that no cracks occur.

A method of forming MOS FETs in the island regions 102a' of the semiconductor substrate thus obtained will now be described. The connecting regions 102b' are first removed by anisotropic etching, with something like KOH, from the island regions 102a' and connecting regions 102b' forming the monocrystalline semiconductor of FIG. 4a, thereby forming independent island regions 102a' (FIG. 4b). The island regions 102a' are also etched to some extent by this etching. Next, impurities are diffused selectively into each island region to form a source region 11, a gate region 12 and a drain region 13 (FIG. 4c). For example, using a P-type substrate, and masking the substrate region which is to become the gate region 12, N type impurities can be diffused selectively to form the source and drain regions at the sides of the gate region. The mask on the substrate region which is to become the gate region can be formed, e.g., by forming an SiO$_2$ film, by CVD or PVD, for example, on the island region and patterning such film to form the mask. After contact regions 14 and 15 are formed in the source and drain regions 11 and 13, and a gate oxide film (not shown) is formed on the gate region 12 (such gate oxide film being formed, e.g., by thermal oxidation of the substrate and selective removal of the oxide to form the gate oxide film), source, gate and drain electrodes 16, 17 and 18 are formed (FIG. 4d), completing an MOS FET. Such source, gate and drain electrodes can be formed by forming an, e.g., Al layer on the source and drain regions (in contact with the contact regions) and gate oxide film, by, e.g., PVD, and patterning the Al layer to form the electrodes. In the drawing, an oxide film covering the source and drain regions, except for the gate oxide film and the contact region, is omitted to simplify the illustration. As can be appreciated by one of ordinary skill in the art, these processing steps for forming the MOS FET are well known, and can be applied to form MOS FETs in the island regions shown in, e.g., FIG. 4b.

When the characteristics of such an MOS FET are evaluated, a channel mobility of between 600 to 900 cm$^2$/V.S. and a change of $V_{th}$ of less than ±0.2 V can be obtained.

When producing such MOS FETs, the island regions 102a on which the devices are formed, and the connecting regions 102b connecting the island regions, are formed after a 0.75 μm thick polycrystalline or amorphous silicon layer is formed on the quartz substrate, and it is preferable in this case to first reduce the thickness of the connecting regions 102b. If the film thickness of the silicon layer is 0.1 μm, for example, after recrystallization these regions can be utilized in the subsequent step of forming the field oxide and gate oxide films in the process of producing the MOS FET, by changing them into SiO$_2$ without removing the regions 102b'. However, if the thickness of the connecting regions 102 is reduced, there is the possibility that their heat resistance is increased and super-cooling will eventually occur during the melting and regrowth. In such a case, the width of the connecting regions could be increased to make up for the reduction in thickness, and thus restrict the increase of heat resistance.

Figure 5:
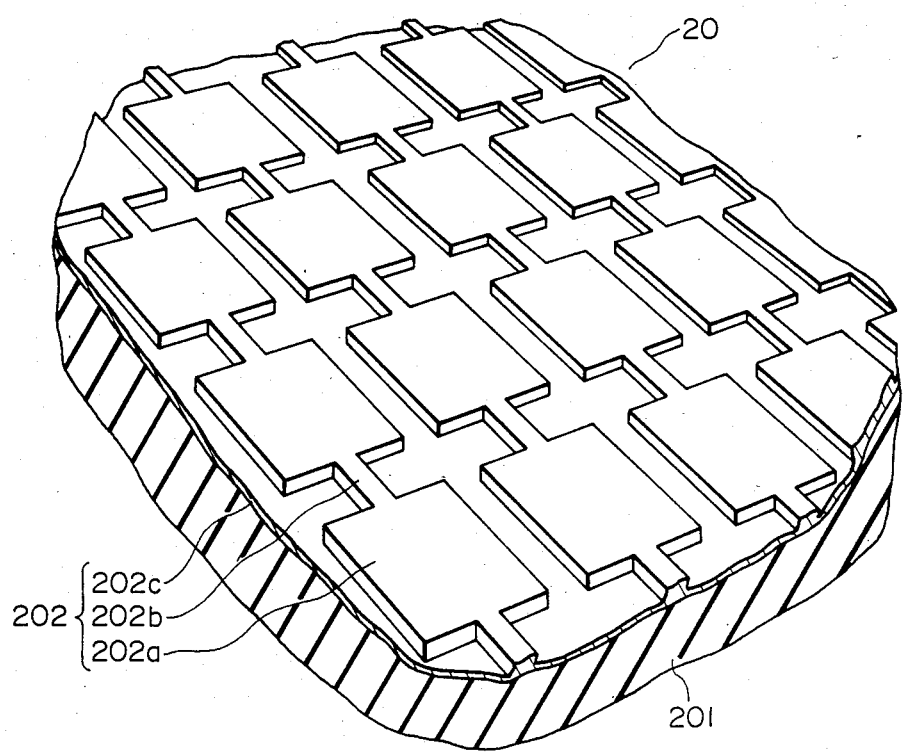
FIG. 5 is a schematic perspective view of another example of the semiconductor substrate used for the method of the present invention.

FIG. 5 shows another example of the semiconductor substrate used for the method of the present invention. The difference between this substrate 20 and the substrate 10 of FIG. 1 is that a thin semiconductor film 202c, which is thinner than the regions 202a and 202b, is formed over the entire surface of one plane of the insulator substrate 201, except for the island regions 202a and the connecting regions 202b. This arrangement makes it easy to flatten the surface of the semiconductor substrate after the recrystallization of the semiconductor layer.

Figure 6A:
FIGS. 6a through 6f are sections of steps in the process of producing the semiconductor substrate of FIG. 5.
Figure 6B:
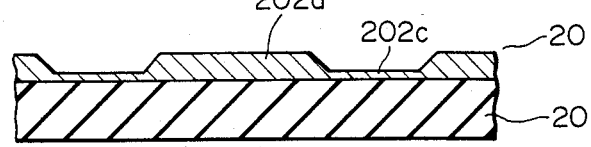
Figure 6C:
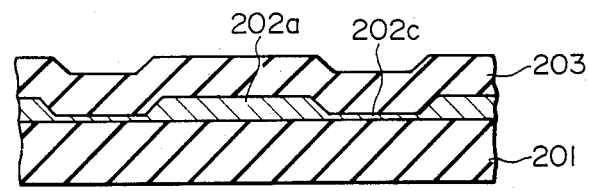
Figure 6D:
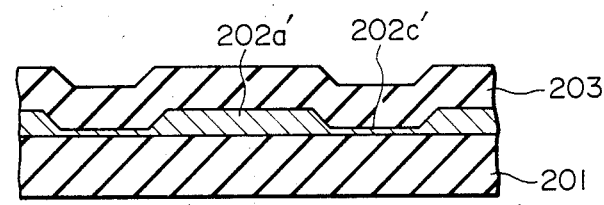

This will now be described with reference to FIG. 6. First, an insulator sheet 201 made of a quartz plate is prepared (FIG. 6a). A polycrystalline silicon layer 202 is formed by low-pressure chemical vapor deposition over the entire surface of one plane of the insulator sheet 201 and, after the portions which will become the island regions 202a and the connecting regions 202b of the polycrystalline layer 202 are covered with a resist film, the exposed portions of the polycrystalline silicon layer are dry-etched to leave a 0.1 μm-thick layer (FIG. 6b). The semiconductor substrate 20 of FIG. 5 is obtained by removing the resist film. Next, a 1.2 μm-thick SiO$_2$ film is formed by CVD over the polycrystalline silicon layer 202 of the semiconductor substrate 20 (FIG. 6c). Thereafter, the polycrystalline silicon layer 202 of the semiconductor substrate 20 is changed into a monocrystalline silicon layer (that is 202a' and 202c') by the zone-melting regrowth method (FIG. 6d). In this case, a silicon layer covers the entire surface of the insulator sheet 201, but no cracking occurs because, apart from the island regions and the connecting regions, the silicon layer is thin.

Figure 6E:
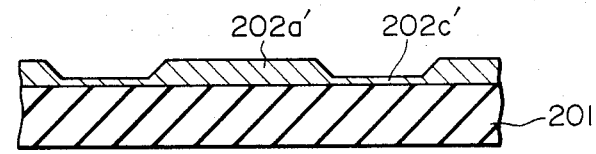
Figure 6F:
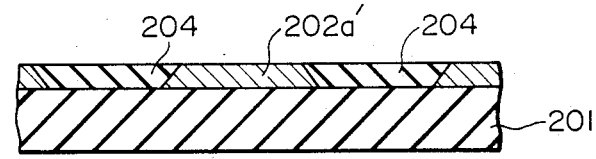

The SiO$_2$ film 203 is then removed using an HF-type of etchant. (FIG. 6e). In this case, the connecting regions are also etched and their thickness reduced. Thereafter, the monocrystalline silicon layer 202c' away from the island regions 202a' is oxidized using a techinque for local oxidation of the semiconductor, to form an SiO$_2$ film 204 of substantially the same thickness as the island regions 202a' between the island regions 202a' (FIG. 6f). In order to form an SiO$_2$ film which has substantially the same thickness as that of the island regions, it is necessary to determine the thickness of the silicon layer 202c', taking into account the increase in thickness due to oxidation. The thickness of the silicon approximately doubles because of the oxidation, and the silicon layer 202c' is preferably about ½ as thick as the island regions 202a'. In this manner, the surface of the island regions 202a' ends up substantially level with the surface of the SiO$_2$ film 204, so that an improvement in the pattern accuracy and the prevention of wire breakages can be accomplished when producing integrated circuits on the semiconductor substrate.

The embodiments described above deal with cases in which the island regions are arranged in lines, and each connecting region is directly connected to two island regions. However, the following modifications are also possible.

FIGS. 7a and 7b show patterns in which island regions 302a are not arranged in a line, and connecting regions 302b are provided therebetween in a crank or oblique shape. Thus, as can be appreciated from FIGS. 7a and 7b, the connection regions 302b extend at least in part in the zone-melting regrowth direction, but need not extend entirely in the regrowth direction.

These patterns can be selected as required to suit the arrangement pattern of devices of an integrated circuit, and provide the advantage that the integrated circuit can be made compact.

FIGS. 7c, 7d and 7e show cases in which the island regions 302a are not connected directly by connecting regions 302b. It is important in this case that, when the island regions are melted and regrown, the flow of heat is smooth and super-cooling does not occur. This object can be accomplished by either making the cross-sectional area of the connecting regions greater than that when the island regions are directly connected, or by reducing the gap G by as much as possible. If the island regions are not directly connected in this manner, the advantage can be obtained that the connecting regions provided for the recrystallization treatment need not be removed.

If the connecting regions are made of a material different from that of the island regions, the connecting regions may be formed by vacuum deposition, sputtering, or the like, after the island regions are formed.

As can be understood clearly from the description above, the present invention can make the orientation of regrown island regions constant, can thus make the characteristics of devices formed in the island regions uniform and can improve the production yield.

While we have shown and described several embodiments in accordance with the present invention, it is understood that the present invention is not limited thereto, but is susceptible of numerous changes and modifications as known to one having ordinary skill in the art and we, therefore, do not wish to be limited to the details shown and described herein, but intend to cover all such modifications as are encompassed by the scope of the appended claims.

What is claimed is:

1. A method of forming a large number of monocrystalline semiconductor regions on a surface of an insulator, the monocrystalline semiconductor regions having a uniform orientation, comprising the steps of:
   (a) forming a large number of island regions and connecting regions, the connecting regions connecting said island regions lying in a predetermined direction, the island and connecting regions being formed on said surface of said insulator, said island regions being made of a polycrystalline or amorphous semiconductor, said connecting regions acting to thermally connect the island regions; and
   (b) melting and regrowing said island regions sequentially in said predetermined direction to form the monocrystalline semiconductor regions having said uniform orientation.

2. The method of forming a large number of monocrystalline semiconductor regions on a surface of an insulator as defined in claim 1, wherein the connecting regions are made of the same semiconducting material as that of the island regions.

3. The method of forming a large number of monocrystalline semiconductor regions on a surface of an insulator as defined in claim 2, wherein the connecting regions have a smaller cross-sectional area at right angles to said predetermined direction than that of said island regions.

4. The method of forming a large number of monocrystalline semiconductor regions on a surface of an insulator as defined in claim 1, wherein said connecting regions are made of a material having a higher heat conductivity than the material of the island regions.

5. The method of forming a large number of monocrystalline semiconductor regions on a surface of an insulator as defined in claim 4, wherein the connecting regions have a smaller cross-sectional area at right angles to said predetermined direction than that of said island regions.

6. The method of forming a large number of monocrystalline semiconductor regions on a surface of an insulator as defined in claim 4, wherein said material having a higher heat conductivity is selected from the group consisting of SiC, Ta, W, Mo and C.

7. The method of forming a large number of monocrystalline semiconductor regions on a surface of an insulator as defined in claim 1, including the further step, before said step (a), wherein said insulator is prepared so as to have a flat surface on one surface thereof, and wherein said island regions and connecting regions are formed on said flat surface.

8. The method of forming a large number of monocrystalline semiconductor regions on a surface of an insulator as defined in claim 1, further comprising forming a thin semiconductor film, thinner than said island regions and connecting regions, on said surface of said insulator on the portions not having the island regions and connecting regions thereon.

9. The method of forming a large number of monocrystalline semiconductor regions on a surface of an insulator as defined in claim 8, wherein said thin semiconductor film is made of silicon and said island regions are made of silicon, and said thin semiconductor film is about ½ the thickness of said island regions.

10. The method of forming a large number of monocrystalline semiconductor regions on a surface of an insulator as defined in claim 1, wherein said connecting regions have gaps, said gaps being sufficiently small such that, upon melting and regrowing the island regions, super-cooling of the material of the island regions does not occur.

11. The method of forming a large number of monocrystalline semiconductor regions on a surface of an insulator as defined in claim 10, wherein said gaps are positioned at the ends of the connecting regions, between the connecting regions and island regions.

12. The method of forming a large number of monocrystalline semiconductor regions on a surface of an insulator as defined in claim 10, wherein said gaps are positioned so as not to be adjacent said islands.

13. The method of forming a large number of monocrystalline semiconductor regions on a surface of an insulator as defined in claim 1, wherein said connecting regions have a smaller thickness than that of said island regions.

14. The method of forming a large number of monocrystalline semiconductor regions on a surface of an insulator as defined in claim 1, wherein said connecting regions are narrower than said island regions.

15. The method of forming a large number of monocrystalline semiconductor regions on a surface of an insulator as defined in claim 1, wherein said insulator is a film of insulating material formed on a sheet member.

16. The method of forming a large number of monocrystalline semiconductor regions on a surface of an insulator as defined in claim 15, wherein said film of insulating material is selected from the group consisting of $SiO_2$ and $Si_3N_4$.

17. The method of forming a large number of monocrystalline semiconductor regions on a surface of an insulator as defined in claim 1, wherein said insulator is a sheet of amorphous quartz or glass.

18. The method of forming a large number of monocrystalline semiconductor regions on a surface of an insulator as defined in claim 1, wherein the monocrystalline semiconductor regions are formed so that the uniform orientation is of a (100) plane.

19. A method of forming a large number of monocrystalline semiconductor regions on a surface of an insulator, the monocrystalline semiconductor regions having a uniform orientation, comprising the steps of:
(a) forming a semiconductor layer consisting of a polycrystalline or amorphous semiconductor on said surface of said insulator;
(b) patterning said semiconductor layer to form a large number of island regions with connecting regions connecting said island regions to one another in a predetermined direction, said connecting regions having a cross-sectional area in a direction at right angles to said predetermined direction which is smaller than that of said island regions;
(c) melting and regrowing said island regions and said connecting regions sequentially in said predetermined direction so as to form said monocrystalline semiconductor regions having said uniform orientation; and
(d) removing said connecting regions.

20. The method of forming a large number of monocrystalline semiconductor regions on a surface of an insulator as defined in claim 12, including the further step, before said step (a), wherein said insulator is prepared so as to have a flat surface on one surface thereof, and wherein said island regions and connecting regions are formed on said flat surface.

21. The method of forming a large number of monocrystalline semiconductor regions on a surface of an insulator as defined in claim 20, comprising the further step, between said steps (b) and (c), of covering said island regions and said connecting regions with an insulator.

22. A method of forming a large number of monocrystalline semiconductor regions on a surface of an insulator, the monocrystalline semiconductor regions having a uniform orientation, comprising the steps of:
(a) forming a semiconductor layer consisting of a polycrystalline or amorphous semiconductor on a flat surface of said insulator;
(b) patterning said semiconductor layer to form a large number of island regions, with connecting regions connecting thermally said island regions to one another in a predetermined direction, said connecting regions having a cross-sectional area at right angles to said predetermined direction which is smaller than that of said island regions; and
(c) melting and regrowing said island regions and said connecting regions sequentially in said predetermined direction so as to form said monocrystalline semiconductor regions having said uniform orientation.

23. The method of forming a large number of monocrystalline semiconductor regions on a surface of an insulator as defined in claim 22, including the further step, before said step (a), wherein said insulator is prepared so as to have said flat surface on one surface thereof, and wherein said island regions and connecting regions are formed on said flat surface.

24. The method of forming a large number of monocrystalline semiconductor regions on the surface of an insulator as defined in claim 23, comprising the further step, between said steps (b) and (c), of covering said island regions and said connecting regions with an insulator.

25. The method of forming a large number of monocrystalline semiconductor regions on a surface of an insulator as defined in claim 22, wherein said connecting regions have gaps, said gaps being sufficiently small such that, upon melting and regrowing the island regions, supercooling of the material of the island regions does not occur.

26. A method of forming a large number of monocrystalline semiconductor regions on a surface of an insulator, the monocrystalline semiconductor regions having a uniform orientation, comprising the steps of:
(a) forming a semiconductor layer consisting of a polycrystalline or amorphous semiconductor on said surface of said insulator;
(b) patterning said semiconductor layer to form a large number of island regions, connecting regions connecting said island regions to one another in a predetermined direction, and which connecting regions have a cross-sectional area at right angles to said predetermined direction, which is smaller than that of said island regions, and film regions covering those portion of said surface of said insulating material other than the portions of said surface covered by said island and connecting regions, and which film regions are thinner than said island and connecting regions;
(c) sequentially melting and regrowing said island regions, said connecting regions and said film region in said predetermined direction so as to form said monocrystalline semiconductor regions having said uniform orientation; and
(d) separating electrically said island regions from one another.

27. The method of forming a large number of monocrystalline semiconductor regions on the surface of an insulator as defined in claim 26, further comprising, after the step of sequentially melting and regrowing, the step of oxidizing said film region such that said film region is formed into an oxide portion.

28. The method of forming a large number of monocrystalline semiconductor regions on the surface of an insulator as defined in claim 27, wherein the thickness of said film region is such that said oxide portion is formed to have a thickness substantially the same as the thickness of said island regions.

29. The method of forming a large number of monocrystalline semiconductor regions on a surface of an insulator as defined in claim 26, including the further step, before said step (a), wherein said insulator is prepared so as to have a flat surface on one surface thereof, and wherein said island regions and connecting regions are formed on said flat surface.

30. The method of forming a large number of monocrystalline semiconductor regions on the surface of an insulator as defined in claim 29, comprising the further step, between said steps (b) and (c), of covering said island regions, said connecting regions and said film region with an insulator layer.

31. A method of forming a large number of monocrystalline semiconductor regions on a surface of an insulator, the monocrystalline semiconductor regions having a uniform orientation, comprising the steps of:
    (a) forming a large number of island regions consisitng of a polycrystalline or amorphous semiconductor on said surface of said insulator;
    (b) connecting said island regions to one another in a predetermined direction by connecting members made of a material with a higher heat conductivity than said semiconductor;
    (c) melting and regrowing said island regions sequentially in said predetermined direction so as to form said monocrystalline semiconductor regions having said uniform orientation; and
    (d) removing said connecting members.

32. The method of forming a large number of monocrystalline semiconductor regions on a surface of an insulator as defined in claim 31, including the further step, before said step (a), wherein said insulator is prepared so as to have a flat surface on one surface thereof, and wherein said island regions and connecting regions are formed on said flat surface.

33. A method of forming a large number of monocrystalline semiconductor regions on a surface of an insulator, the monocrystalline semiconductor regions having a uniform orientation, comprising the steps of:
    (a) forming a semiconductor layer consisting of a polycrystalline or amorphous semiconductor on said surface of said insulator;
    (b) patterning said semiconductor layer to form a large number of island regions with connecting regions connecting said island regions to one another in a predetermined direction, said connecting regions having a cross-sectional area in a direction at right angles to said predetermined direction which is smaller than that of said island regions; and
    (c) melting and regrowing said island regions and said connecting regions sequentially in said predetermined direction so as to form said monocrystalline semiconductor regions having said uniform orientation.

34. The method of forming a large number of monocrystalline semiconductor regions on a surface of an insulator as defined in claim 33, including the further step, before said step (a), wherein said insulator is prepared so as to have a flat surface on one surface thereof, and wherein said island regions and connecting regions are formed on said flat surface.

35. The method of forming a large number of monocrystalline semiconductor regions on a surface of an insulator as defined in claim 33, wherein said connecting regions have gaps, said gaps being sufficiently small such that, upon melting and regrowing the island regions, supercooling of the material of the island regions does not occur.

* * * * *